(12) United States Patent
Iida et al.

(10) Patent No.: US 10,120,128 B2
(45) Date of Patent: Nov. 6, 2018

(54) SEMICONDUCTOR DEVICE HAVING SEMICONDUCTOR OPTICAL WAVEGUIDE AND OPPOSED INSULATOR-FILLED TRENCH AND MANUFACTURING METHOD THEREOF

(71) Applicant: Renesas Electronics Corporation, Tokyo (JP)

(72) Inventors: Tetsuya Iida, Ibaraki (JP); Yasutaka Nakashiba, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/729,727

(22) Filed: Oct. 11, 2017

(65) Prior Publication Data

US 2018/0128974 A1   May 10, 2018

(30) Foreign Application Priority Data

Nov. 7, 2016   (JP) ................................. 2016-216913

(51) Int. Cl.
   *G02B 6/122*   (2006.01)
   *G02B 6/136*   (2006.01)
   (Continued)

(52) U.S. Cl.
   CPC ............. *G02B 6/122* (2013.01); *G02B 6/136* (2013.01); *G02B 2006/12142* (2013.01);
   (Continued)

(58) Field of Classification Search
   CPC ............ G02B 2006/12142; G02B 6/12; G02B 6/122; G02B 6/136; G02F 1/01; G02F 1/011; H01L 23/48; H01L 23/481; H01L 23/522; H01L 23/5226; H01L 27/12; H01L 27/1203
   See application file for complete search history.

(56) References Cited

U.S. PATENT DOCUMENTS 7,110,629 B2 *  9/2006  Bjorkman ................ G02B 6/12
                                                  385/14
7,454,102 B2 * 11/2008  Keyser .................... G02B 6/12
                                                  385/129
(Continued)

FOREIGN PATENT DOCUMENTS

JP   2012-027198 A    2/2012
JP   2015-526883 A    9/2015
JP   2015-191031 A   11/2015

*Primary Examiner* — Andrew Jordan
(74) *Attorney, Agent, or Firm* — Mattingly & Malur, PC

(57) ABSTRACT

A semiconductor device includes: a first substrate; a surface insulating film formed over an upper surface of the first substrate; a BOX layer formed over the surface insulating film; an optical waveguide made of an SOI layer formed on the BOX layer; and a first interlayer insulating film formed over the BOX layer so as to cover the optical waveguide. The semiconductor device further includes: a trench formed in the surface insulating film and the first substrate below the optical waveguide; and a cladding layer made of a buried insulating film buried in the trench. A thickness of the BOX layer is 1 μm or less, and a distance from an interface between the optical waveguide and the BOX layer to a bottom surface of the trench is 2 μm or more.

15 Claims, 10 Drawing Sheets

(51) Int. Cl.
- H01L 27/12 (2006.01)
- G02B 6/12 (2006.01)
- H01L 23/48 (2006.01)
- G02F 1/01 (2006.01)
- H01L 23/522 (2006.01)

(52) U.S. Cl.
CPC ............ *G02F 1/011* (2013.01); *H01L 23/481* (2013.01); *H01L 23/5226* (2013.01); *H01L 27/1203* (2013.01)

(56) References Cited

U.S. PATENT DOCUMENTS

| | | | | |
|---|---|---|---|---|
| 7,532,777 B2* | 5/2009 | Mitomi | ............... | G02F 1/0356 385/129 |
| 2004/0114853 A1* | 6/2004 | Bjorkman | ............... | G02B 6/12 385/14 |
| 2007/0080414 A1* | 4/2007 | Bjorkman | ............... | G02B 6/12 257/432 |
| 2007/0253663 A1* | 11/2007 | Keyser | ............... | G02B 6/12 385/36 |
| 2008/0050082 A1* | 2/2008 | Mitomi | ............... | G02F 1/0356 385/131 |
| 2009/0087137 A1* | 4/2009 | Doan | ............... | B82Y 20/00 385/14 |
| 2013/0322811 A1 | 12/2013 | Maede | | |
| 2015/0277041 A1 | 10/2015 | Nakagawa et al. | | |
| 2015/0316719 A1 | 11/2015 | Nakagawa et al. | | |
| 2018/0128974 A1* | 5/2018 | Iida | ............... | G02B 6/122 |

* cited by examiner

SEMICONDUCTOR DEVICE HAVING SEMICONDUCTOR OPTICAL WAVEGUIDE AND OPPOSED INSULATOR-FILLED TRENCH AND MANUFACTURING METHOD THEREOF

CROSS-REFERENCE TO RELATED APPLICATION

The present application claims priority from Japanese Patent Application No. 2016-216913 filed on Nov. 7, 2016, the content of which is hereby incorporated by reference into this application.

TECHNICAL FIELD OF THE INVENTION

The present invention relates to a semiconductor device and a manufacturing method thereof, and can be suitably applied to a semiconductor device incorporating various optical devices and a manufacturing method thereof.

BACKGROUND OF THE INVENTION

Japanese Patent Application Laid-Open Publication No. 2012-027198 (Patent Document 1) describes an optical semiconductor device including a semiconductor layer made of intrinsic semiconductor, an optical waveguide which is a part of the semiconductor layer, a first impurity region of a first conductivity type formed in the semiconductor layer on one side of the optical waveguide, a second impurity region of a second conductivity type formed in the semiconductor layer on the other side of the optical waveguide, and a capacitor having a part of the second impurity region as a lower electrode.

Also, Japanese Patent Application Laid-Open Publication No. 2015-191031 (Patent Document 2) describes an optical device including an SOI substrate in which an insulating layer with a thickness of 200 nm or less is buried, an optical waveguide made of a III-V compound semiconductor material formed on the SOI substrate, and a light leakage prevention layer formed inside the SOI substrate below the optical waveguide for preventing leakage of light from inside of the optical waveguide to the SOI substrate.

Further, Japanese Patent Application Laid-Open Publication No. 2015-526883 (Patent Document 3) describes a method and a structure for providing a silicon-on-insulator substrate in which a photonic device is formed and a core material of a waveguide is optically decoupled from a supporting substrate by a shallow trench isolation region.

SUMMARY OF THE INVENTION

In order to reduce propagation loss of an optical waveguide, it is necessary to increase a thickness of a BOX (Buried Oxide) layer constituting an SOI (Silicon On Insulator) wafer to, for example, about 2 μm to 4 μm. However, in order to increase the thickness of the BOX layer, it is necessary to lengthen film-forming time of the BOX layer, which raises the problem of increase of the manufacturing cost of the SOI wafer. In addition, if the thickness of the BOX layer is increased, warpage or slippage of the SOI wafer due to heat treatment at 900° C. or higher, discharge breakdown of the semiconductor device due to charge accumulation, and the like are likely to occur in the manufacturing process of the semiconductor device, which raises the problem of decrease of manufacturing yield of the semiconductor device.

Other problems and novel characteristics will be apparent from the description of the present specification and the accompanying drawings.

A semiconductor device according to one embodiment includes: a first substrate; a surface insulating film formed on an upper surface of the first substrate; a BOX layer formed on the surface insulating film; an optical waveguide formed on the BOX layer and made of an SOI layer; a trench located below the optical waveguide and formed from an interface between the BOX layer and the surface insulating film into the surface insulating film and the first substrate; and a buried insulating film buried in the trench. A thickness of the BOX layer is 1 μm or less, and a distance from an interface between the optical waveguide and the BOX layer to a bottom surface of the trench is 2 μm or more.

A manufacturing method of a semiconductor device according to one embodiment includes: a step of preparing a first substrate having a surface insulating film formed on an upper surface, a lower surface, and a side surface thereof; and a step of forming a trench in the surface insulating film and the first substrate by sequentially processing the surface insulating film and the first substrate from an upper surface side of the first substrate, and then filling the trench with a buried insulating film to form a cladding layer made of the buried insulating film. The method further includes: a step of preparing a second substrate having a BOX layer formed on an upper surface thereof; a step of bonding the first substrate and the second substrate together by bonding the BOX layer to the surface insulating film and the cladding layer on the upper surface side of the first substrate by heat treatment; and a step of processing the second substrate to a predetermined thickness to form an SOI layer made of the second substrate. The method further includes: a step of processing the SOI layer to form an optical waveguide in a region overlapping the cladding layer in a plan view; and a step of forming a first interlayer insulating film on the BOX layer so as to cover the optical waveguide. In addition, a thickness of the BOX layer is 1 μm or less, and a distance from an interface between the optical waveguide and the BOX layer to a bottom surface of the trench is 2 μm or more.

According to one embodiment, it is possible to reduce the manufacturing cost of the semiconductor device and to improve the manufacturing yield.

BRIEF DESCRIPTIONS OF THE DRAWINGS

DESCRIPTIONS OF THE PREFERRED EMBODIMENTS

Figure 1:
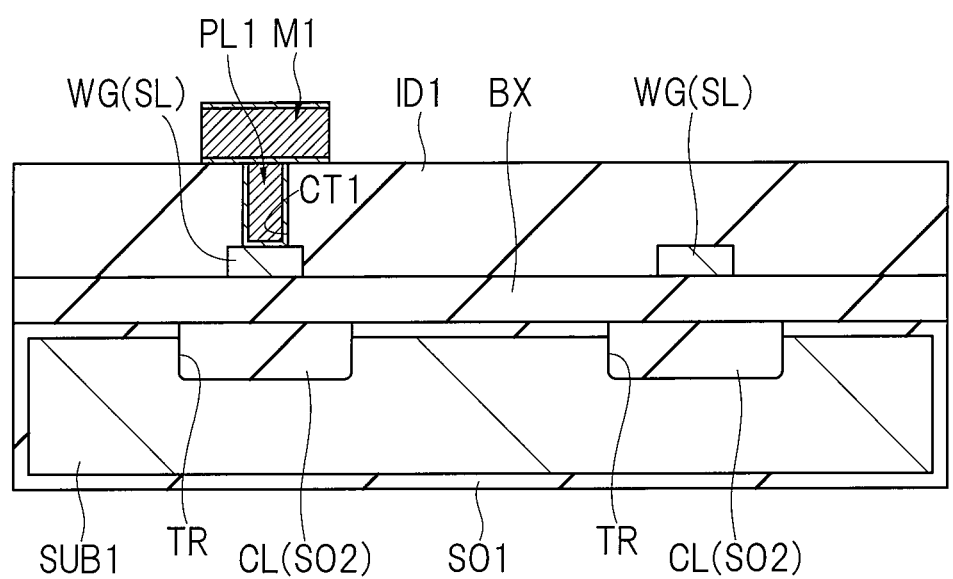
FIG. 1 is a cross-sectional view showing a principal part of a semiconductor device (optical waveguide) according to a first embodiment.

In the embodiments described below, the invention will be described in a plurality of sections or embodiments when required as a matter of convenience. However, these sections or embodiments are not irrelevant to each other unless otherwise stated, and the one relates to the entire or apart of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps and the like) are not always indispensable unless otherwise stated or except the case where the components are apparently indispensable in principle.

Also, even when referring to "made of A", "made up of A", "have A" and "include A", elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, components having the same function are denoted by the same reference characters in principle throughout the drawings for describing the embodiments, and the repetitive description thereof will be omitted. Further, the size of respective portions does not correspond to that of an actual device in sectional views, and a specific portion is shown in a relatively enlarged manner in some cases so as to make the drawings easy to see.

Hereinafter, embodiments will be described in detail based on drawings.

First Embodiment

<Structure of Semiconductor Device (Optical Waveguide)>

A structure of a semiconductor device according to the first embodiment will be described with reference to FIG. 1. FIG. 1 is a cross-sectional view showing a principal part of the semiconductor device according to the first embodiment. Here, an optical waveguide for optical signal (referred to also as waveguide, transmission path or optical signal line) WG is exemplified as an optical device.

As shown in FIG. 1, an SOI substrate is used for the semiconductor device. The SOI substrate includes a first substrate SUB1, a surface insulating film SO1, for example, a silicon oxide film formed on an upper surface (first main surface, front surface), aside surface, and a lower surface (second main surface, rear surface) of the first substrate SUB1, a BOX layer (referred to also as insulating film or insulating layer) BX formed over the upper surface of the first substrate SUB1 via the surface insulating film SO1, and an SOI layer (referred to also as semiconductor layer or silicon layer) SL formed over the BOX layer BX.

The first substrate SUB1 is made of monocrystalline silicon and has a thickness of, for example, about 50 µm to 100 µm. A thickness of the surface insulating film SO1 is, for example, about 0.4 µm to 1 µm. A thickness of the BOX layer BX is, for example, 1 µm or less. An appropriate range of a thickness of the SOI layer SL is considered to be, for example, 100 nm to 500 nm, and a range having the center value of 400 nm is considered to be most preferable.

The optical waveguide WG is constituted of the SOI layer SL. Here, a rectangular optical waveguide will be described as an example of the optical waveguide WG, but the optical waveguide WG is not limited to this and may be a rib-type optical waveguide or the like. Note that the rectangular optical waveguide is a waveguide whose cross section orthogonal to a traveling direction of light has a quadrilateral shape. In addition, the rib-type optical waveguide is a waveguide whose cross section orthogonal to a traveling direction of light has a convex shape, and has a structure in which a convex portion having an effect of confining a lateral light is provided on a surface of a flat plate.

The SOI layer SL constituting the optical waveguide WG is processed into a flat plate shape and extends in a direction perpendicular to the paper surface. Therefore, an optical signal introduced into the optical waveguide WG travels in the direction perpendicular to the paper surface. A height of the optical waveguide WG (vertical direction in the paper surface) corresponds to the thickness of the SOI layer SL, and is, for example, about 100 nm to 500 nm. Impurities are introduced into the optical waveguide WG, and an impurity concentration thereof is, for example, in the range of $10^{15}$ cm$^{-3}$ to $10^{19}$ cm$^{-3}$, and a representative value thereof is about $10^{15}$ cm$^{-3}$.

Further, a trench TR is formed in the surface insulating film SO1 and the first substrate SUB1 below the optical waveguide WG from an upper surface side of the first substrate SUB1. The trench TR does not reach a lower surface of the first substrate SUB1. A buried insulating film SO2, for example, a silicon oxide film is buried in the trench TR, and a cladding layer CL is constituted of the buried insulating film SO2. A depth of the trench TR from an interface between the BOX layer BX and the surface insulating film SO1 is, for example, 1 μm or more, and about 1 μm to 3 μm can be exemplified.

Also, it is preferable that a total thickness of the BOX layer BX and the surface insulating film SO1 is, for example, 1 μm or more. Further, it is preferable that a distance from an interface between the optical waveguide WG and the BOX layer BX to a bottom surface of the trench TR is, for example, 2 μm or more. Thus, since the insulating film (BOX layer BX and cladding layer CL) with a thickness of 2 μm or more is present between a lower surface of the optical waveguide WG and the first substrate SUB1 just below the optical waveguide WG, propagation loss of the optical waveguide WG can be reduced.

The optical waveguide WG is covered with a first interlayer insulating film ID1. The first interlayer insulating film ID1 is made of, for example, a silicon oxide film, and has a thickness of, for example, 1 μm or more, preferably, 2 μm or more. A first layer wiring M1 is formed on the first interlayer insulating film ID1. The first layer wiring M1 is constituted of a main conductive material made of, for example, aluminum, copper or aluminum-copper alloy and a barrier metal formed on a lower surface and an upper surface of the main conductive material. The barrier metal is provided for preventing diffusion of the metal of the main conductive material constituting the first layer wiring Ml, and is made of, for example, titanium, tantalum, titanium nitride or tantalum nitride. The barrier metal has a thickness of, for example, about 5 nm to 20 nm.

A connection hole (referred to also as contact hole) CT1 that reaches the optical waveguide WG is formed in the first interlayer insulating film ID1. A plug (referred to also as buried electrode or buried contact) PL1 using tungsten as a main conductive material is formed via a barrier metal in the connection hole CT1. The barrier metal is provided for preventing diffusion of the metal of the main conductive material constituting the plug PL1, and is made of, for example, titanium or titanium nitride. The barrier metal has a thickness of, for example, about 5 nm to 20 nm. The optical waveguide WG and the first layer wiring M1 are electrically connected to each other through the plug PL1.

Though not shown, wirings in upper layers, protective films and others are further formed.

In the SOI substrate according to the first embodiment, the thickness of the BOX layer BX is set to 1 μm or less. Thus, film-forming time of the BOX layer BX can be shortened, so that the manufacturing cost of the SOI substrate can be reduced. In addition, since the thickness of the BOX layer BX is small, occurrence of warpage or slippage of the SOI substrate can be suppressed even when heat treatment at 900° C. or higher is performed to the SOI substrate in the manufacturing process of the semiconductor device. Further, the discharge breakdown or the like of the optical device and the electronic device due to charge accumulation is less likely to occur. Accordingly, the manufacturing yield of the semiconductor device can be improved.

Also, since the thickness of the BOX layer BX is small, there is a concern about propagation delay of the optical waveguide WG, but the BOX layer BX and the cladding layer CL (buried insulating film SO2) buried in the trench TR are present between the optical waveguide WG and the first substrate SUB1 and the distance from the interface between the optical waveguide WG and the BOX layer BX to the bottom surface of the trench TR is 2 μm or more. Namely, as described above, since the insulating film with a thickness of 2 μm or more is present between the optical waveguide WG and the first substrate SUB1, electrostatic capacitance between the optical waveguide WG and the first substrate SUB1 can be suppressed, so that the propagation loss of the optical waveguide WG can be reduced.

In the case where the BOX layer BX and the cladding layer CL are provided between the optical waveguide WG and the first substrate SUB1, the propagation loss of the optical waveguide WG can be reduced by about 20% to 30% in comparison with the case where only the BOX layer BX is provided between the optical waveguide WG and the first substrate SUB1.

<Manufacturing Method of SOI Substrate>

A manufacturing method of the SOI substrate according to the first embodiment will be described in the order of process with reference to FIGS. 2 to 6. FIGS. 2 to 6 are cross-sectional views each showing a principal part in a manufacturing process of the SOI substrate according to the first embodiment.

Figure 2:
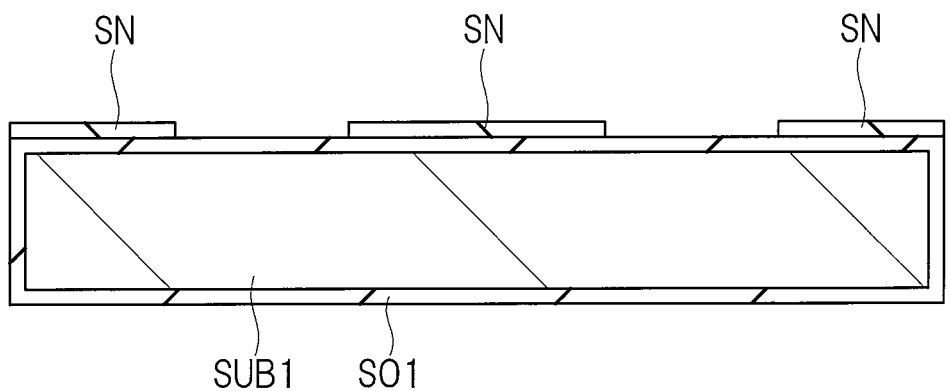
FIG. 2 is a cross-sectional view showing a principal part in a manufacturing process of an SOI substrate according to the first embodiment.

First, as shown in FIG. 2, the first substrate SUB1 made of monocrystalline silicon (substrate with a substantially circular planar shape referred to as wafer at this stage) is prepared. The thickness of the first substrate SUB1 is, for example, about 700 μm to 800 μm. Next, heat treatment is performed to the first substrate SUB1 to form the surface insulating film SO1, for example, a silicon oxide film on the upper surface, the lower surface, and the side surface of the first substrate SUB1. The thickness of the surface insulating film SO1 is, for example, about 0.4 μm to 1 μm.

Next, after an insulating film, for example, a silicon nitride film SN is formed over the surface insulating film SO1 on the upper surface of the first substrate SUB1, the silicon nitride film SN in a region where the cladding layer CL is to be formed is removed by the dry etching method using a resist mask. A thickness of the silicon nitride film SN is, for example, about 100 nm to 200 nm.

Figure 3:
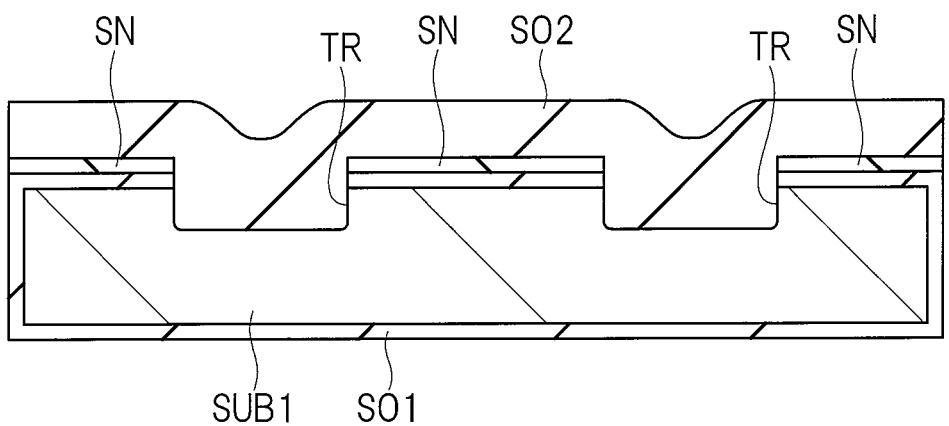
FIG. 3 is a cross-sectional view showing a principal part in the manufacturing process of the SOI substrate continued from FIG. 2.

Next, as shown in FIG. 3, the trench TR which does not reach the lower surface of the first substrate SUB1 is formed in the surface insulating film SO1 and the first substrate SUB1 by sequentially processing the surface insulating film SO1 and the first substrate SUB1 with using the silicon nitride film SN as a mask. The trench TR is formed in the region where the cladding layer CL is to be formed. In other words, the trench TR is formed so as to overlap an optical device to be formed in a latter process, that is, the optical waveguide WG in a plan view. The depth of the trench TR from the interface between the silicon nitride film SN and the surface insulating film SO1 is, for example, 1 μm or more, and about 1 μm to 3 μm can be exemplified.

Next, a silicon oxide film (not shown) is formed on an inner wall of the trench TR by the thermal oxidation method. Alternatively, after all of the surface insulating film SO1 formed on the lower surface and the side surface of the first substrate SUB1 is once removed before forming the silicon oxide film on the inner wall of the trench TR, the silicon oxide film is formed on the inner wall of the trench TR by the thermal oxidation method, and the surface insulating film SO1 is formed again on the lower surface and the side surface of the first substrate SUB1 simultaneously with the silicon oxide film. Thereafter, the buried insulating film SO2, for example, a silicon oxide film is formed on the silicon nitride film SN by, for example, the CVD (Chemical Vapor Deposition) method so as to fill the inside of the trench TR.

Figure 4:
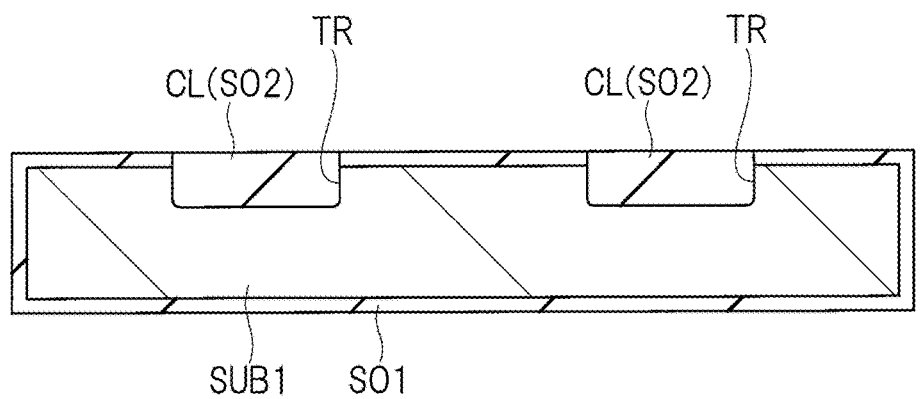
FIG. 4 is a cross-sectional view showing a principal part in the manufacturing process of the SOI substrate continued from FIG. 3.

Next, as shown in FIG. 4, the buried insulating film SO2 and the silicon nitride film SN are polished by, for example, the CMP (Chemical Mechanical Polishing) method to remove the silicon nitride film SN, and the buried insulating film SO2 is buried in the trench TR to form the cladding layer CL made of the buried insulating film SO2. At this time, the surface insulating film SO1 on the upper surface of the first substrate SUB1 is not removed such that the upper surface of the first substrate SUB1 is not exposed.

Figure 5:
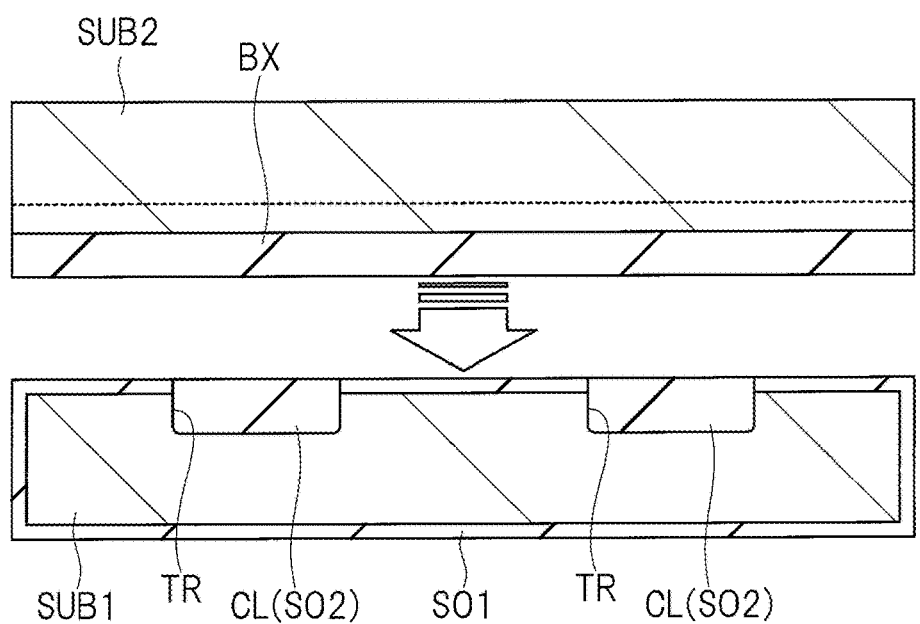
FIG. 5 is a cross-sectional view showing a principal part in the manufacturing process of the SOI substrate continued from FIG. 4.

Next, as shown in FIG. 5, a second substrate SUB2 made of monocrystalline silicon (substrate with a substantially circular planar shape referred to as wafer at this stage) is prepared. The BOX layer BX is formed on an upper surface (first main surface, front surface) of the second substrate SUB2. The BOX layer BX is made of, for example, a silicon oxide film, and has a thickness of, for example, 1 μm or less. Further, hydrogen is ion-implanted into a region having a predetermined depth (for example, about 100 nm to 500 nm) from the upper surface of the second substrate SUB2. The region in which hydrogen is ion-implanted is indicated by a dotted line in FIG. 5.

Since the thickness of the BOX layer BX is set to, for example, 1 μm or less, which is smaller than the thickness used conventionally (for example, about 2 μm to 4 μm), the film-forming time of the BOX layer BX is shortened, so that the manufacturing cost of the second substrate SUB2 having the BOX layer BX can be reduced to about 50% to 70%.

Next, after the second substrate SUB2 is turned upside down, the BOX layer BX is brought into contact with the surface insulating film SO1 and the cladding layer CL, and then the BOX layer BX is bonded to the surface insulating film SO1 and the cladding layer CL by heat treatment.

Figure 6:
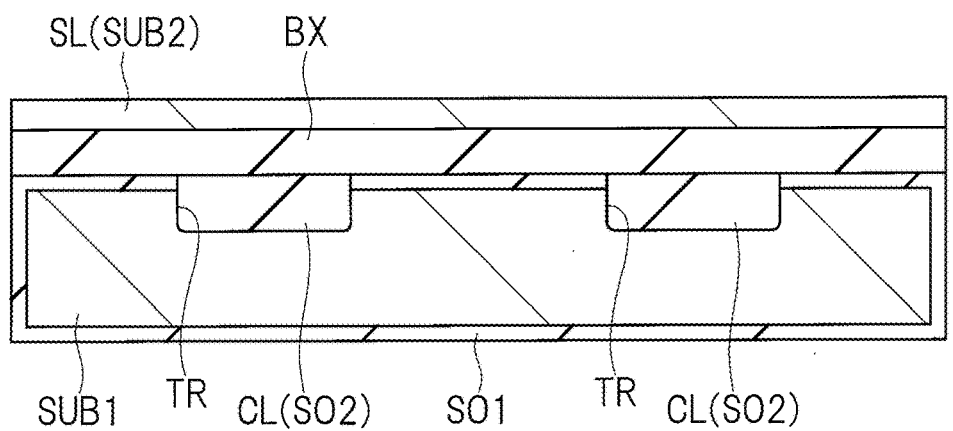
FIG. 6 is a cross-sectional view showing a principal part in the manufacturing process of the SOI substrate continued from FIG. 5.

Next, as shown in FIG. 6, by using the hydrogen embrittlement phenomenon, the SOI layer SL is formed by removing a part of the second substrate SUB2 along a cutting line corresponding to the region into which hydrogen has been ion-implanted. It is preferable that a thickness of the SOI layer SL is in a range of 100 nm to 500 nm, and is, for example, about 400 nm. Thus, the SOI substrate constituted of the first substrate SUB1, the cladding layer CL, the surface insulating film SO1, the BOX layer BX, and the SOI layer SL is completed.

Here, in order to reduce the propagation loss of the optical device, for example, the optical waveguide WG, it is preferable that the total thickness of the BOX layer BX and the surface insulating film SO1 is, for example, 1 μm or more. Further, it is preferable that a distance from the interface between the SOI layer SL and the BOX layer BX to the bottom surface of the trench TR is, for example, 2 μm or more.

<Manufacturing Method of Semiconductor Device (Optical Waveguide)>

Figure 7:
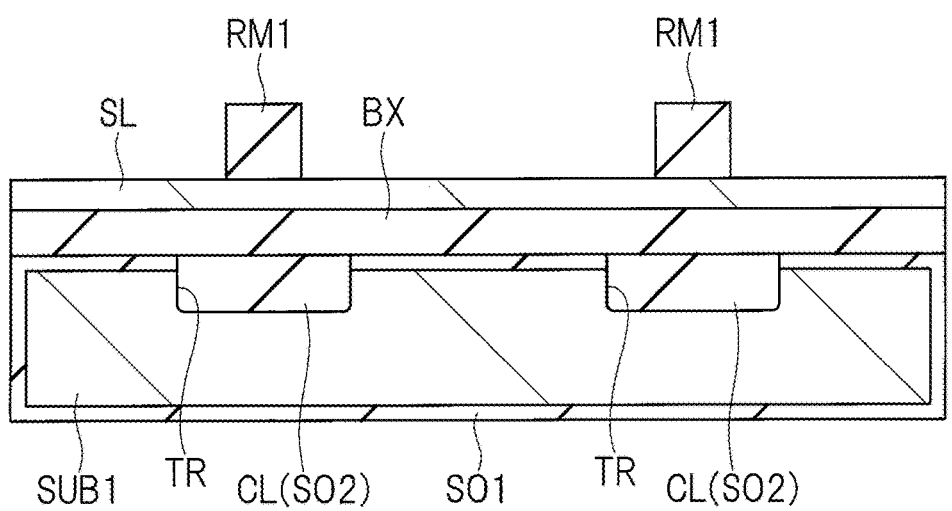
FIG. 7 is a cross-sectional view showing a principal part in a manufacturing process of the semiconductor device (optical waveguide) according to the first embodiment.
Figure 8:
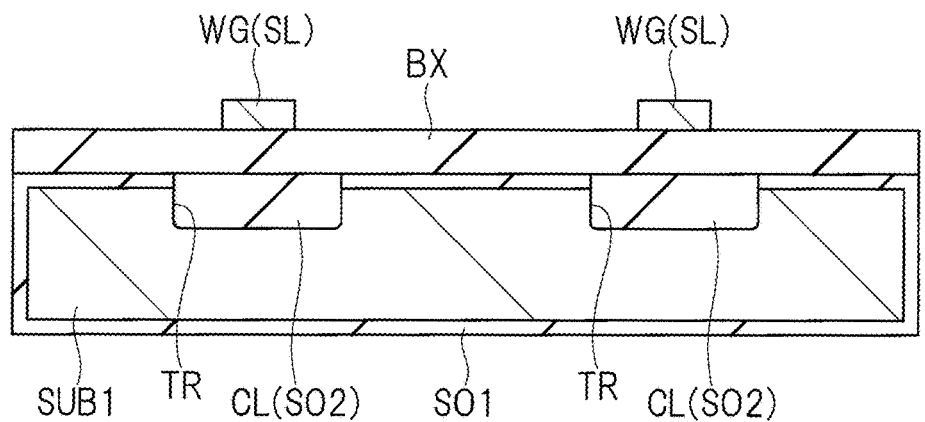
FIG. 8 is a cross-sectional view showing a principal part in the manufacturing process of the semiconductor device continued from FIG. 7.
Figure 9:
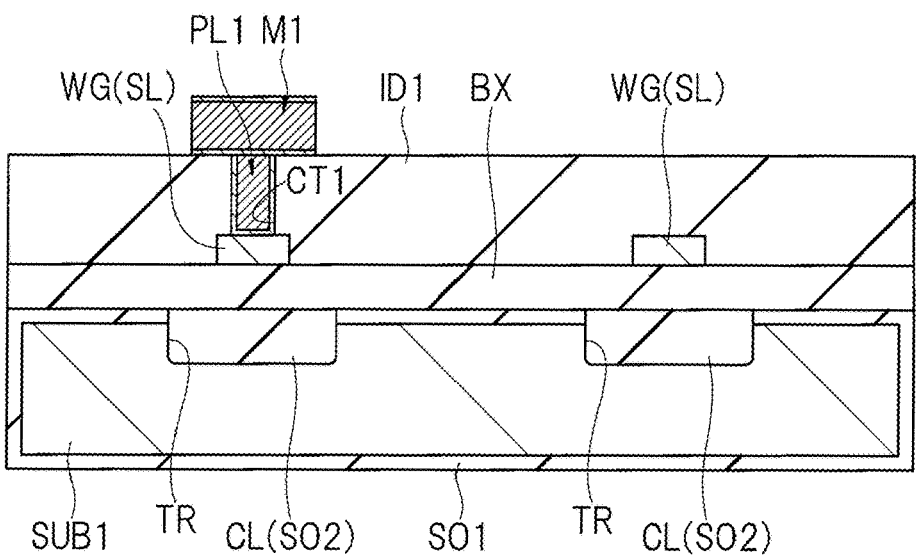
FIG. 9 is a cross-sectional view showing a principal part in the manufacturing process of the semiconductor device continued from FIG. 8.

A manufacturing method of the semiconductor device (optical waveguide) according to the first embodiment will be described in the order of process with reference to FIGS. 7 to 9. FIGS. 7 to 9 are cross-sectional views each showing a principal part in a manufacturing process of the semiconductor device (optical waveguide) according to the first embodiment.

First, the SOI substrate manufactured by the <Manufacturing Method of SOI Substrate> described above is prepared. Namely, the SOI substrate is constituted of the first substrate SUB1, the cladding layer CL, the surface insulating film SO1, the BOX layer BX, and the SOI layer SL.

Next, as shown in FIG. 7, a resist mask RM1 is formed on the SOI layer SL. The resist mask MR1 is formed by applying a resist film over the SOI layer SL and then patterning the resist film by performing the exposure and development process thereto.

Since the cladding layer CL buried in the trench TR is formed in the first substrate SUB1, the pattern of the cladding layer CL can be recognized in the exposure process, and it is possible to use the cladding layer CL for the alignment of the exposure mask. Accordingly, it is possible to accurately perform the alignment between the cladding layer CL and the optical waveguide WG to be formed later.

Next, as shown in FIG. 8, the SOI layer SL is processed by the dry etching method using the resist mask RM1 to form the optical waveguide WG. Subsequently, after the resist mask RM1 is removed, impurities are introduced into the optical waveguide WG. The impurity concentration thereof is, for example, in the range of $10^{15}$ $cm^{-3}$ to $10^{19}$ $cm^{-3}$, and a representative value thereof is, for example, about $10^{15}$ $cm^{-3}$.

Since the optical waveguide WG is formed above the cladding layer CL, the insulating film constituted of the BOX layer BX and the cladding layer CL and having a thickness of 2 μm or more is present between the optical waveguide WG and the first substrate SUB1. Thus, electrostatic capacitance between the optical waveguide WG and the first substrate SUB1 can be suppressed, so that the propagation loss of the optical waveguide WG can be reduced.

Next, as shown in FIG. 9, the first interlayer insulating film ID1 is formed over the BOX layer BX so as to cover the optical waveguide WG. The first interlayer insulating film ID1 is made of, for example, a silicon oxide film, and has a thickness of, for example, 1 μm or more, preferably, 2 μm or more. Subsequently, an upper surface of the first interlayer insulating film ID1 is planarized by, for example, the CMP method.

Next, after the connection hole CT1 which reaches the optical waveguide WG is formed in the first interlayer insulating film ID1, a conductive film is buried in the connection hole CT1 via a barrier metal, thereby forming the plug PL1 using the buried conductive film as a main conductive material.

Next, a barrier metal, a metal film (main conductive material), and a barrier metal are sequentially deposited by, for example, the sputtering method over the first interlayer insulating film ID1, and the stacked film thereof is processed by the dry etching method using a resist mask, thereby forming the first layer wiring M1 electrically connected to the plug PL1. The main conductive material constituting the first layer wiring M1 is made of, for example, aluminum or the like, and the barrier metal is made of, for example, titanium, tantalum, titanium nitride, tantalum nitride or the like.

Thereafter, wirings in upper layers, protective films and others are further formed. Subsequently, the surface insulating film SO1 on the lower surface of the first substrate SUB1 is removed, and the first substrate SUB1 is ground from the lower surface side to reduce the thickness of the first substrate SUB1 to, for example, about 50 μm to 100 μm. Subsequently, the surface insulating film SO1 is formed again on the lower surface of the first substrate SUB1. Through the process described above, the semiconductor device is almost completed.

Though the description thereof is omitted here, an electronic device is also formed on the SOI substrate in addition to the optical device. In the manufacture of the electronic device, heat treatment at 900° C. or higher is performed to the SOI substrate for the activation of ion-implanted impurities or the like. However, since the thickness of the BOX layer BX is, for example, 1 μm or less, occurrence of warpage or slippage of the SOI substrate can be suppressed even when heat treatment at 900° C. or higher is performed.

Also, a dry etching apparatus provided with an electrostatic chuck, a CVD apparatus or the like is used in the manufacturing process of the semiconductor device. However, since the thickness of the BOX layer BX is, for example, 1 μm or less, the discharge breakdown or the like of the optical device and the electronic device due to charge accumulation is less likely to occur. Accordingly, the manufacturing yield of the semiconductor device can be improved.

As described above, according to the first embodiment, since the thickness of the BOX layer BX constituting the SOI substrate is reduced to, for example, 1 μm or less, the manufacturing cost of the SOI substrate and the semiconductor device can be reduced. Further, since it is possible to prevent occurrence of warpage or slippage of the SOI substrate and discharge breakdown or the like of a semiconductor element due to charge accumulation can be prevented, the manufacturing yield of the semiconductor device.

In addition, since the insulating film (BOX layer BX and cladding layer CL) with a thickness of 2 μm or more is formed between the optical waveguide WG and the first substrate SUB1, it is also possible to prevent propagation delay of the optical waveguide WG.

Second Embodiment

<Structure of Semiconductor Device (Optical Waveguide and CMOS Device)>

Figure 10:
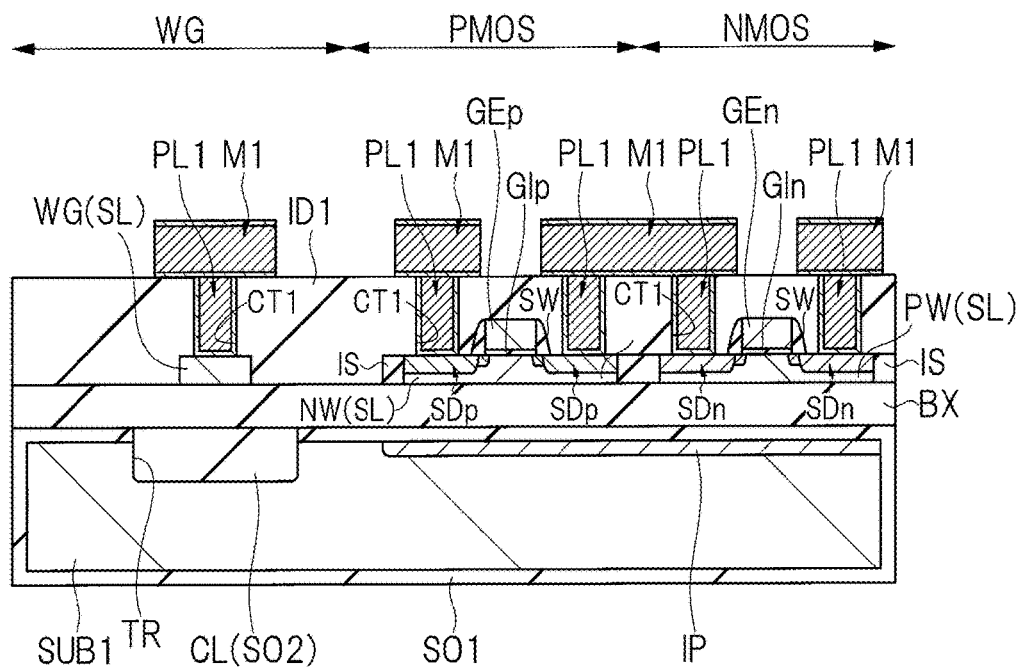
FIG. 10 is a cross-sectional view showing a principal part of a semiconductor device (optical waveguide and CMOS device) according to a second embodiment.

A semiconductor device according to the second embodiment will be described with reference to FIG. 10. FIG. 10 is a cross-sectional view showing a principal part of the semiconductor device according to the second embodiment.

When the thickness of the BOX layer BX of the SOI substrate is set to, for example, 1 μm or less, high frequency noise for modulation becomes a problem in the electronic device. Therefore, as a countermeasure against the high frequency noise for modulation, an impurity introduction region IP obtained by ion-implanting impurities into the first substrate SUB1 is formed in an electronic device forming region.

Hereinafter, a structure of the semiconductor device will be described in detail. Since the configuration of the optical device, for example, the optical waveguide WG is the same as that of the first embodiment described above, the description thereof is omitted here. Also, a CMOS (Complementary Metal Oxide Semiconductor) device is exemplified as the electronic device, and a p channel MOSFET (MOS Field Effect Transistor) is described as a p MOS and an n channel MOSFET (MOS Field Effect Transistor) is described as an n MOS.

In a semiconductor device in which an electronic device, for example, a CMOS device and an optical device are mounted together as shown in FIG. 10, the CMOS device is disposed on the BOX layer BX.

The p MOS is formed in an active region made of the SOI layer SL surrounded by an element isolation IS formed in the SOI layer SL, and an n type well NW is formed in the active region. The element isolation IS is constituted of an insulating film, for example, a silicon oxide film buried in a trench.

A gate insulating film GIp made of, for example, a silicon oxide film is formed on a main surface of the SOI layer SL (n type well NW) in a p MOS forming region. Further, a gate electrode GEp made of, for example, a polycrystalline silicon film is formed on the gate insulating film GIp.

A sidewall spacer SW constituted of a stacked film of a silicon oxide film and a silicon nitride film is formed on a side wall of the gate electrode GEp.

In the SOI layer SL (n type well NW) on both sides of the gate electrode GEp of the p MOS, a pair of first p type impurity regions with relatively low concentration and a pair of second p type impurity regions with relatively high concentration are formed, and each of source and drain SDp of the p MOS is constituted of the first p type impurity region and the second p type impurity region. The first p type impurity region is formed in the n type well NW below the side wall of the gate electrode GEp, and the second p type impurity region is formed apart from the side wall of the gate electrode GEp by a predetermined distance (width of the first p type impurity region).

The n MOS is formed in an active region made of the SOI layer SL surrounded by the element isolation IS formed in the SOI layer SL, and a p type well PW is formed in the active region.

A gate insulating film GIn made of, for example, a silicon oxide film is formed on a main surface of the SOI layer SL (p type well PW) in an n MOS forming region. Further, a gate electrode GEn made of, for example, a polycrystalline silicon film is formed on the gate insulating film GIn.

A sidewall spacer SW constituted of a stacked film of a silicon oxide film and a silicon nitride film is formed on a side wall of the gate electrode GEn.

In the SOI layer SL (p type well PW) on both sides of the gate electrode GEn of the n MOS, a pair of first n type impurity regions with relatively low concentration and a pair of second n type impurity regions with relatively high concentration are formed, and each of source and drain SDn of the n MOS is constituted of the first n type impurity region and the second n type impurity region. The first n type impurity region is formed in the p type well PW below the side wall of the gate electrode GEn, and the second n type impurity region is formed apart from the side wall of the gate electrode GEn by a predetermined distance (width of the first n type impurity region).

In addition, the impurity introduction region IP having a predetermined depth from the upper surface of the first substrate SUB1 and having an impurity concentration higher than an impurity concentration of the first substrate SUB1 is formed in the first substrate SUB1 in the p MOS forming region and the n MOS forming region. The impurity introduction region IP is formed by ion-implanting impurities such as phosphorus or boron into the first substrate SUB1, and a trap level is formed in the impurity introduction region IP.

Since flow of high frequency current to the first substrate SUB1 can be prevented by forming the impurity introduction region IP in the first substrate SUB1 in the p MOS forming region and the n MOS forming region, the influence of high frequency noise for modulation on the CMOS device can be reduced.

Further, the first interlayer insulating film ID1 is formed so as to cover the p MOS and the n MOS. Then, the first layer wiring M1 is electrically connected to each of the source and drain SDp of the p MOS and the source and drain SDn of the n MOS through the plug PL1 buried in the connection hole CT1 formed in the first interlayer insulating film ID1. Though not shown, the first layer wiring M1 is electrically connected to each of the gate electrode GEp of the p MOS and the gate electrode GEn of the n MOS.

Though not shown, wirings in upper layers, protective films and others are further formed.

<Manufacturing Method of SOI Substrate>

Figure 11:
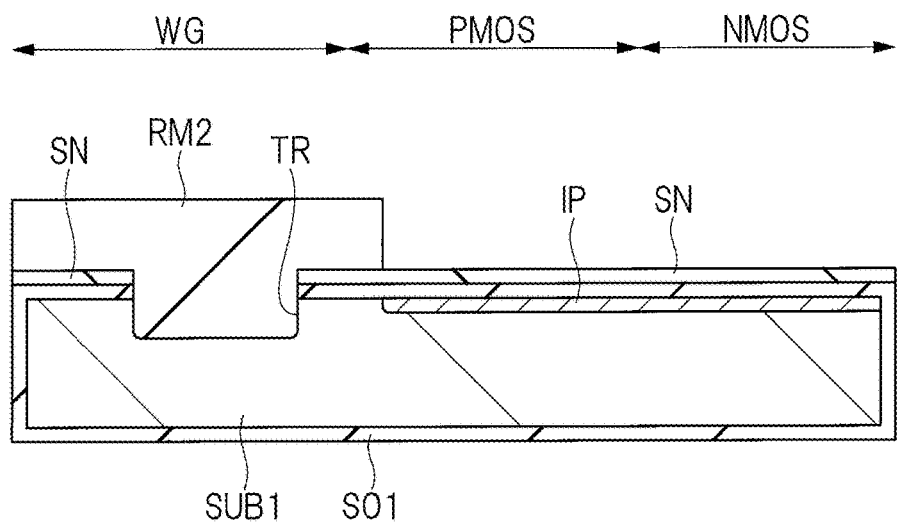
FIG. 11 is a cross-sectional view showing a principal part in a manufacturing process of an SOI substrate according to the second embodiment.
Figure 12:
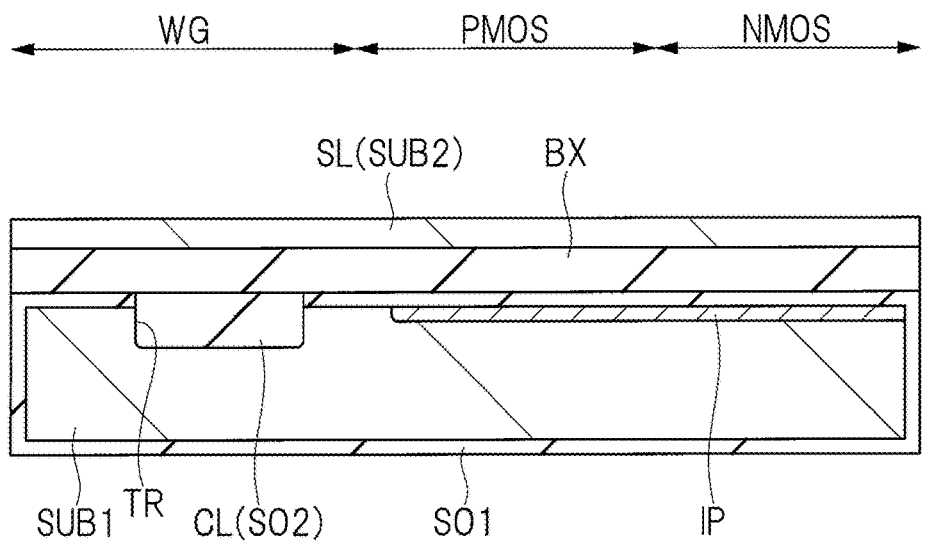
FIG. 12 is a cross-sectional view showing a principal part in the manufacturing process of the SOI substrate continued from FIG. 11.

A manufacturing method of the SOI substrate according to the second embodiment will be described in the order of process with reference to FIGS. 11 and 12. FIGS. 11 and 12 are cross-sectional views each showing a principal part in a manufacturing process of the SOI substrate according to the second embodiment.

In the same manner as the first embodiment described above, the surface insulating film SO1, for example, a silicon oxide film is formed on the upper surface, the lower surface, and the side surface of the first substrate SUB1, and then a mask made of an insulating film, for example, the silicon nitride film SN is formed on the surface insulating film SO1 on the upper surface of the first substrate SUB1 (see FIG. 2). Subsequently, the trench TR is formed in the surface insulating film SO1 and the first substrate SUB1 with using the silicon nitride film SN as a mask (see FIG. 3).

Next, as shown in FIG. 11, after a resist mask RM2 is formed on the silicon nitride film SN, impurities, for example, phosphorus or boron are ion-implanted into the first substrate SUB1 in the electronic device forming region. Subsequently, heat treatment to activate the impurities that have been ion-implanted into the first substrate SUB1 is performed to form the impurity introduction region IP. Note that this heat treatment may be used also as the heat treatment to bond the first substrate SUB1 and the second substrate SUB2 or the heat treatment in the manufacturing process of the semiconductor device (CMOS device or the like).

Thereafter, in the same manner as the first embodiment described above, the buried insulating film SO2, for example, a silicon oxide film is buried in the trench TR to form the cladding layer CL (see FIG. 4), and then the second substrate SUB2 on which the BOX layer BX has been formed is bonded to the first substrate SUB1 (see FIG. 5). Further, the SOI layer SL is formed by removing a part of the second substrate SUB2 (see FIG. 6).

Thus, as shown in FIG. 12, the SOI substrate constituted of the first substrate SUB1 having the impurity introduction region IP formed therein, the cladding layer CL, the surface insulating film SO1, the BOX layer BX, and the SOI layer SL is completed.

<Manufacturing Method of Semiconductor Device (Optical Waveguide and CMOS Device)>

Figure 13:
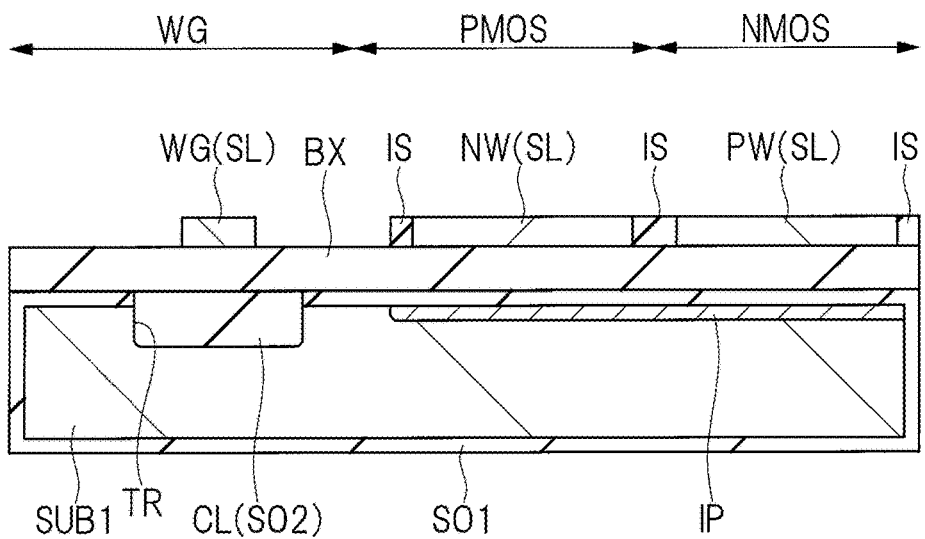
FIG. 13 is a cross-sectional view showing a principal part in a manufacturing process of the semiconductor device (optical waveguide and CMOS device) according to the second embodiment.
Figure 14:
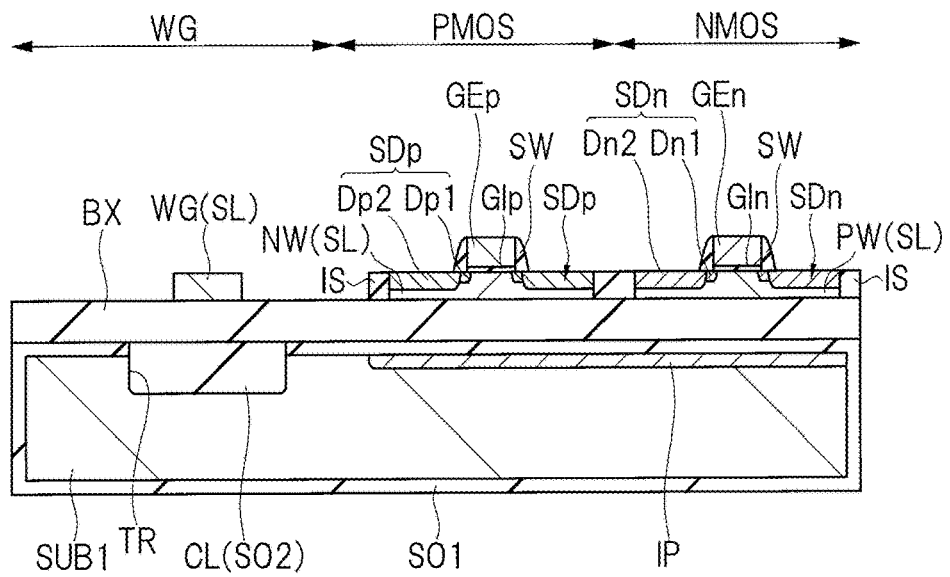
FIG. 14 is a cross-sectional view showing a principal part in the manufacturing process of the semiconductor device continued from FIG. 13.
Figure 15:
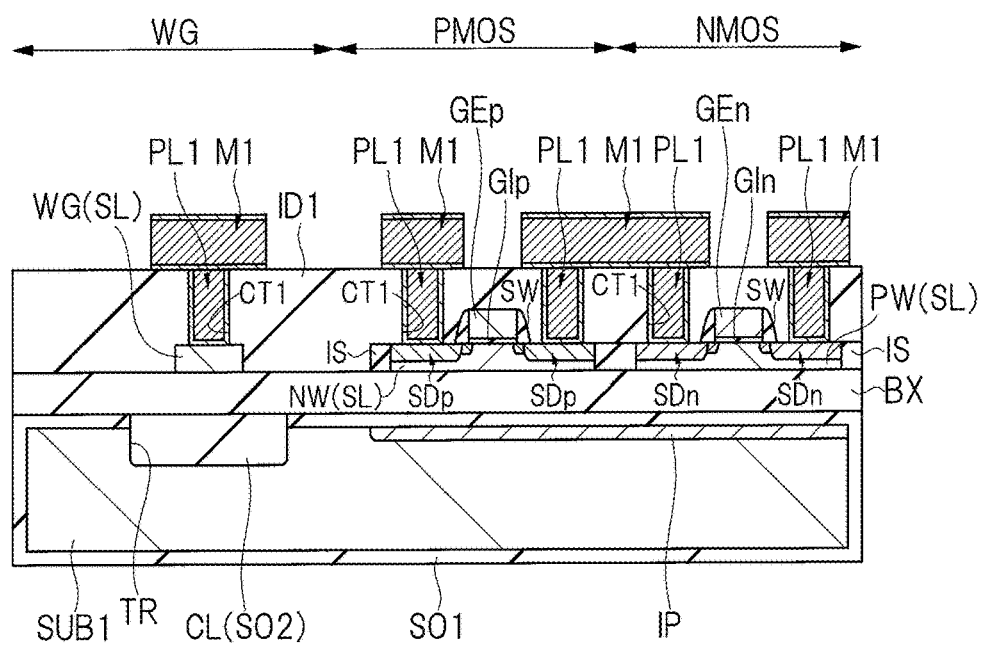
FIG. 15 is a cross-sectional view showing a principal part in the manufacturing process of the semiconductor device continued from FIG. 14.

A manufacturing method of the semiconductor device (optical waveguide and CMOS device) according to the second embodiment will be described in the order of process with reference to FIGS. 13 to 15. FIGS. 13 to 15 are cross-sectional views each showing a principal part in a manufacturing process of the semiconductor device (optical waveguide and CMOS device) according to the second embodiment. Since the manufacturing method of the optical waveguide is the same as that of the first embodiment described above, the description of the overlapping parts is omitted.

First, the SOI substrate manufactured by the <Manufacturing Method of SOI Substrate> described above is prepared. Namely, the SOI substrate is constituted of the first substrate SUB1 having the impurity introduction region IP formed therein, the cladding layer CL, the surface insulating film SO1, the BOX layer BX, and the SOI layer SL.

Next, as shown in FIG. 13, the SOI layer SL is processed by the dry etching method using a resist mask formed on the SOI layer SL to form the optical waveguide WG in the optical device forming region, and the SOI layer SL is left in the electronic device forming region.

Next, the element isolation IS is formed in the electronic device forming region. The element isolation IS is formed by forming a trench in the SOI layer SL and then burying an insulating film, for example, a silicon oxide film in this trench.

Next, after removing the resist mask, impurities are introduced into the optical waveguide WG in the optical device forming region, n type impurities are introduced into the SOI layer SL in the p MOS forming region of the electronic device to form the n type well NW, and p type impurities are introduced into the SOI layer SL in the n MOS forming region of the electronic device to form the p type well PW.

Next, as shown in FIG. 14, the gate insulating film GIp and the gate insulating film GIn are formed on the upper surfaces of the SOI layer SL in the p MOS forming region and the n MOS forming region, respectively. The gate insulating films GIp and GIn are each made of, for example, a silicon oxide film. Subsequently, after a polycrystalline silicon film is deposited by, for example, the CVD method on the gate insulating films GIp and GIn, the polycrystalline silicon film is processed by the dry etching method using a resist mask, thereby forming the gate electrode GEp of the p MOS and the gate electrode GEn of the n MOS.

Next, p type impurities such as boron or boron fluoride are ion-implanted into the n type well NW with using the gate electrode GEp as a mask, thereby forming a pair of first p type impurity regions Dp1 in the n type well NW on both sides of the gate electrode GEp. Similarly, n type impurities such as phosphorus or arsenic are ion-implanted into the p type well PW with using the gate electrode GEn as a mask, thereby forming a pair of first n type impurity regions Dn1 in the p type well PW on both sides of the gate electrode GEn.

Next, the sidewall spacer SW constituted of a stacked film of a silicon oxide film and a silicon nitride film is formed on each side wall of the gate electrode GEp and the gate electrode GEn.

Next, p type impurities such as boron or boron fluoride are ion-implanted into the n type well NW with using the gate electrode GEp and the sidewall spacer SW as a mask, thereby forming a pair of second p type impurity regions Dp2 in the n type well NW on both sides of the gate electrode GEp. Similarly, n type impurities such as phosphorus or arsenic are ion-implanted into the p type well PW with using the gate electrode GEn and the sidewall spacer SW as a mask, thereby forming a pair of second n type impurity regions Dn2 in the p type well PW on both sides of the gate electrode GEn.

Thereafter, heat treatment is performed to activate the impurities that have been ion-implanted into the p MOS forming region and the n MOS forming region. Thus, source and drain SDp each constituted of the first p type impurity region Dp1 and the second p type impurity region Dp2 of the p MOS are formed, and source and drain SDn each constituted of the first n type impurity region Dn1 and the second n type impurity region Dn2 of the n MOS are formed.

Next, as shown in FIG. 15, the first interlayer insulating film ID1 is formed over the BOX layer BX so as to cover the optical waveguide WG in the optical device forming region and the p MOS and the n MOS in the electronic device forming region. The first interlayer insulating film ID1 is made of, for example, a silicon oxide film, and has a thickness of, for example, 1 µm or more, preferably, 2 µm or more. Subsequently, an upper surface of the first interlayer insulating film ID1 is planarized by, for example, the CMP method.

Next, connection holes CT1 each reaching the optical waveguide WG, the source and drain SDp and the gate electrode GEp of the p MOS, and the source and drain SDn and the gate electrode GEn of the n MOS are formed in the first interlayer insulating film ID1. Subsequently, a conductive film is buried in the connection hole CT1 via a barrier metal, thereby forming the plug PL1 using the buried conductive film as a main conductive material.

Next, a barrier metal, a metal film (main conductive material), and a barrier metal are sequentially deposited by, for example, the sputtering method over the first interlayer insulating film ID1, and the stacked film thereof is processed by the dry etching method using a resist mask, thereby forming the first layer wiring M1 electrically connected to the plug PL1. The main conductive material constituting the first layer wiring M1 is made of, for example, aluminum or the like, and the barrier metal is made of, for example, titanium, tantalum, titanium nitride, tantalum nitride or the like.

Thereafter, wirings in upper layers, protective films and others are further formed. Through the process described above, the semiconductor device is almost completed.

As described above, according to the second embodiment, since the impurity introduction region IP with a relatively high concentration is formed in the first substrate SUB1 in the electronic device forming region, even when the thickness of the BOX layer BX constituting the SOI substrate is reduced to, for example, 1 µm or less, the influence of high frequency noise for modulation on the electronic device can be reduced, and thus the reliability of the semiconductor device can be improved.

Third Embodiment

<Structure of Semiconductor Device (Optical Modulator and Accumulated Charge Extraction and Heat Dissipation Electrode)>

Figure 16:
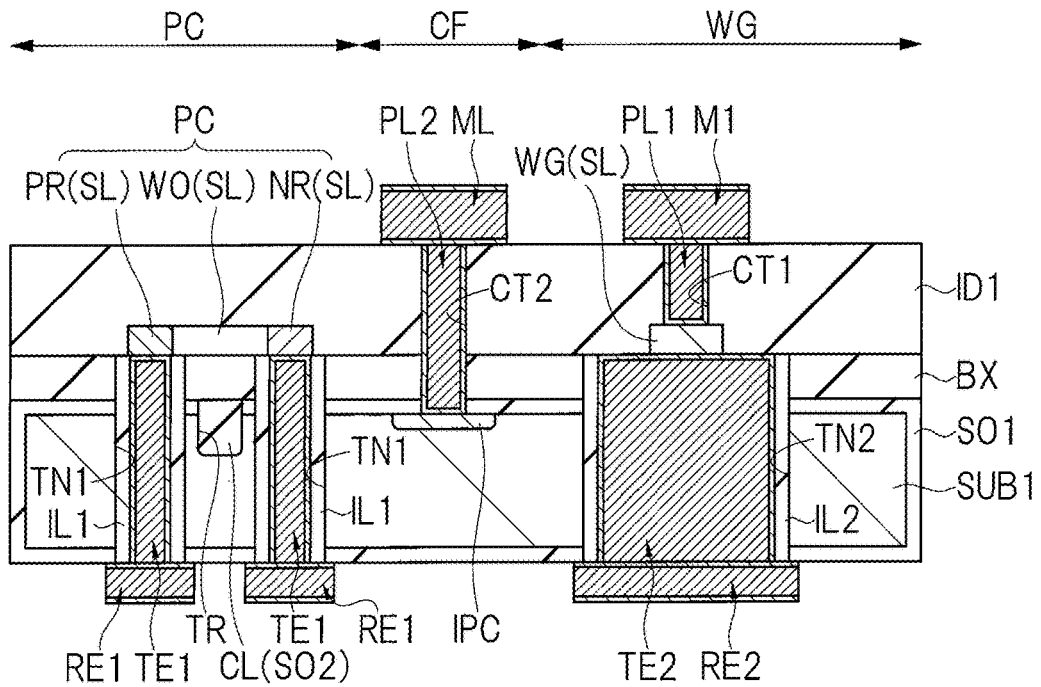
FIG. 16 is a cross-sectional view showing a principal part of a semiconductor device (optical modulator and through electrode) according to a third embodiment.

A structure of a semiconductor device according to the third embodiment will be described with reference to FIG. 16. FIG. 16 is a cross-sectional view showing a principal part of the semiconductor device according to the third embodiment. Here, an optical modulator PC having a pin structure provided with a through electrode TE1 for power supply in an SOI substrate is exemplified as the optical device, and the optical waveguide WG provided with an accumulated charge extraction and heat dissipation electrode (through electrode TE2) is further exemplified as the optical device.

Hereinafter, the structure of the semiconductor device will be described in detail.

First, the optical modulator PC will be described.

As shown in FIG. 16, the optical modulator PC is constituted of the SOI layer SL formed via the BOX layer BX on the upper surface side of the first substrate SUB1.

The optical modulator PC extends in a direction perpendicular to the paper surface, and an optical waveguide (referred to also as core layer) WO is formed at the center of the optical modulator PC when viewed in a horizontal direction in the paper surface orthogonal to the direction perpendicular to the paper surface. Therefore, an optical signal introduced into the optical waveguide WO travels in the direction perpendicular to the paper surface. The optical waveguide WO is made of intrinsic-type semiconductor, that is, i-type semiconductor.

In the SOI layer SL on one side (left side in FIG. 16) of the optical waveguide WO, p type impurities are introduced to form a p type semiconductor PR. The p type semiconductor PR is formed in parallel to the optical waveguide WO. Also, in the SOI layer SL on the other side (right side in FIG. 16) of the optical waveguide WO, n type impurities are introduced to form an n type semiconductor NR. The n type semiconductor NR is formed in parallel to the optical waveguide WO. Namely, the semiconductor layer SL between the p type semiconductor PR and the n type semiconductor NR is the optical waveguide WO made of intrinsic semiconductor, and the pin structure is formed.

The optical modulator PC is covered with the first interlayer insulating film ID1. Also, though details thereof will be described later, the through electrode TE1 penetrating through the SOI substrate is connected to each of the p type semiconductor PR and the n type semiconductor NR.

Carrier density in the optical waveguide WO made of intrinsic semiconductor is changed by a voltage applied to the p type semiconductor PR and the n type semiconductor NR, and the refractive index in that region is changed. Thus, the effective refractive index to the light propagating through the optical modulator PC is changed, and the phase of the light output from the optical modulator PC can be changed.

The trench TR is formed in the surface insulating film SO1 and the first substrate SUB1 below the optical waveguide WO from the upper surface side of the first substrate SUB1. The trench TR does not reach the lower surface of the first substrate SUB1. The buried insulating film SO2, for example, a silicon oxide film is buried in the trench TR, and the cladding layer CL is constituted of the buried insulating film SO2. A depth of the trench TR from an interface between the BOX layer BX and the surface insulating film SO1 is, for example, 1 µm or more, and about 1 µm to 3 µm can be exemplified.

Also, it is preferable that a total thickness of the BOX layer BX and the surface insulating film SO1 is, for example, 1 µm or more. Further, it is preferable that a distance from an interface between the optical waveguide WO and the BOX layer BX to a bottom surface of the trench TR is, for example, 2 µm or more. Thus, as described above in the first embodiment, propagation loss of the optical waveguide WO can be reduced.

Further, the first through holes TN1 each penetrating through the BOX layer BX, the first substrate SUB1, and the surface insulating film SO1 formed on the upper surface and the lower surface of the first substrate SUB1 and reaching the p type semiconductor PR and the n type semiconductor NR are formed. An insulating film IL1 is formed on a side surface of the first thorough hole TN1. The insulating film IL1 has a thickness of, for example, about 0.5 µm.

A copper plating film is formed in the first through hole TN1 via a barrier metal, and the through electrode TE1 is constituted of the barrier metal and the copper plating film. The barrier metal is made of, for example, titanium, tantalum, titanium nitride, tantalum nitride or the like.

The surface insulating film SO1 formed on the lower surface of the first substrate SUB1 functions as a protective film for preventing metal contamination from a rear surface of the SOI substrate, and the insulating film IL1 formed on the side surface of the first through hole TN1 functions as a protective film for preventing metal contamination from the through electrode TE1. In addition, the insulating film IL1 has also a function to isolate the through electrode TE1 and the first substrate SUB1 from each other.

A rear surface electrode RE1 electrically connected to the through electrode TE1 is formed on the lower surface of the first substrate SUB1. The rear surface electrode RE1 is constituted of a main conductive material made of, for example, aluminum, copper, or aluminum-copper alloy and a barrier metal formed on each of an upper surface and a lower surface of the main conductive material. The barrier metal is provided for preventing diffusion of the metal of the main conductive material constituting the rear surface electrode RE1, and is made of, for example, titanium, tantalum, titanium nitride, tantalum nitride or the like.

Next, the accumulated charge extraction and heat dissipation electrode will be described.

As shown in FIG. 16, the accumulated charge extraction and heat dissipation electrode is constituted of a second through electrode TE2 penetrating through the SOI substrate, and is electrically connected to the lower surface of the optical waveguide WG. Since the configuration of the optical waveguide WG is the same as that of the first embodiment described above, the description thereof is omitted here.

A second through hole TN2 penetrating through the BOX layer BX, the first substrate SUB1, and the surface insulating film SO1 formed on the upper surface and the lower surface of the first substrate SUB1 and reaching the lower surface of the optical waveguide WG is formed. An insulating film IL2 is formed on a side surface of the second through hole TN2. The insulating film IL2 has a thickness of, for example, about 0.5 μm.

A copper plating film is formed in the second through hole TN2 via a barrier metal, and the through electrode TE2 is constituted of the barrier metal and the copper plating film. The barrier metal is made of, for example, titanium, tantalum, titanium nitride, tantalum nitride or the like.

The surface insulating film SO1 formed on the lower surface of the first substrate SUB1 functions as a protective film for preventing metal contamination from a rear surface of the SOI substrate, and the insulating film IL2 formed on the side surface of the second through hole TN2 functions as a protective film for preventing metal contamination from the through electrode TE2. In addition, the insulating film IL2 has also a function to isolate the through electrode TE2 and the first substrate SUB1 from each other.

A rear surface electrode RE2 electrically connected to the through electrode TE2 is formed on the lower surface of the first substrate SUB1. The rear surface electrode RE2 is constituted of a main conductive material made of, for example, aluminum, copper, or aluminum-copper alloy and a barrier metal formed on each of an upper surface and a lower surface of the main conductive material. The barrier metal is provided for preventing diffusion of the metal of the main conductive material constituting the rear surface electrode RE2, and is made of, for example, titanium, tantalum, titanium nitride, tantalum nitride or the like.

As described above, the first layer wiring M1 electrically connected to the upper surface of the optical waveguide WG is formed on an upper surface side of the optical waveguide WG, and the through electrode TE2 (accumulated charge extraction and heat dissipation electrode) electrically connected to the lower surface of the optical waveguide WG is formed on a lower surface side of the optical waveguide WG. Accordingly, the charge accumulated in the SOI substrate and the heat used for modulation or the like can be easily eliminated by applying a voltage between the first layer wiring M1 and the through electrode TE2 electrically connected through the optical waveguide WG.

However, there is a concern about potential variation of the first substrate SUB1 due to the formation of the through electrodes TE1 and TE2. In such a case, a fixing electrode part CF for fixing the potential of the first substrate SUB1 is formed.

As shown in FIG. 16, an impurity introduction region IPC having a predetermined depth from the upper surface of the first substrate SUB1 and having an impurity concentration higher than the impurity concentration of the first substrate SUB1 is formed. The impurity introduction region IPC is formed by ion-implanting impurities into the first substrate SUB1.

A connection hole CT2 that reaches the impurity introduction region IPC is formed in the surface insulating film SO1, the BOX layer BX, and the first interlayer insulating film ID1 on the impurity introduction region IPC, and a plug PL2 using tungsten as a main conductive material is formed via a barrier metal in the connection hole CT2. The impurity introduction region IPC and an electrode wiring ML in the same layer as the first layer wiring M1 are electrically connected through the plug PL2. The potential of the first substrate SUB1 can be fixed by applying a potential to the electrode wiring ML.

<Manufacturing Method of Semiconductor Device (Optical Modulator and Accumulated Charge Extraction and Heat Dissipation Electrode)>

Figure 17:
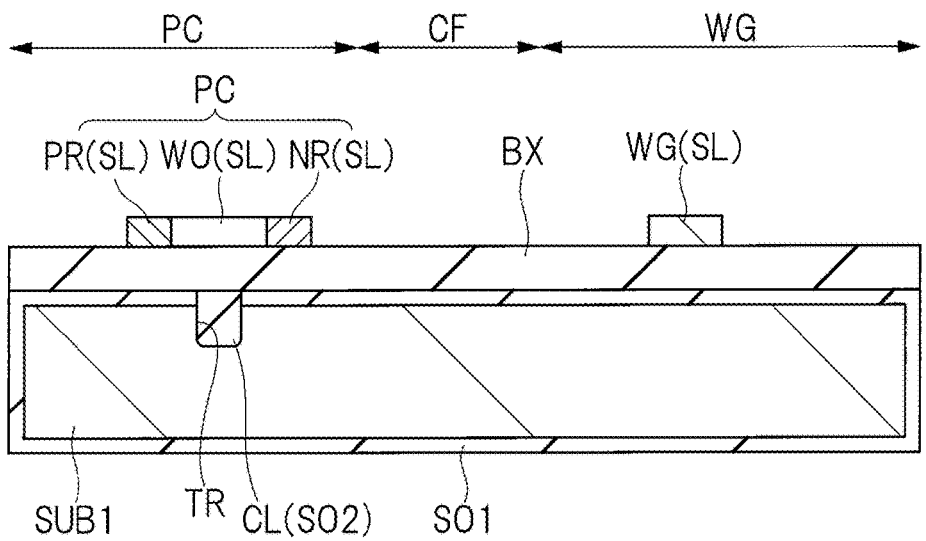
FIG. 17 is a cross-sectional view showing a principal part in a manufacturing process of the semiconductor device (optical modulator and through electrode) according to the third embodiment.
Figure 18:
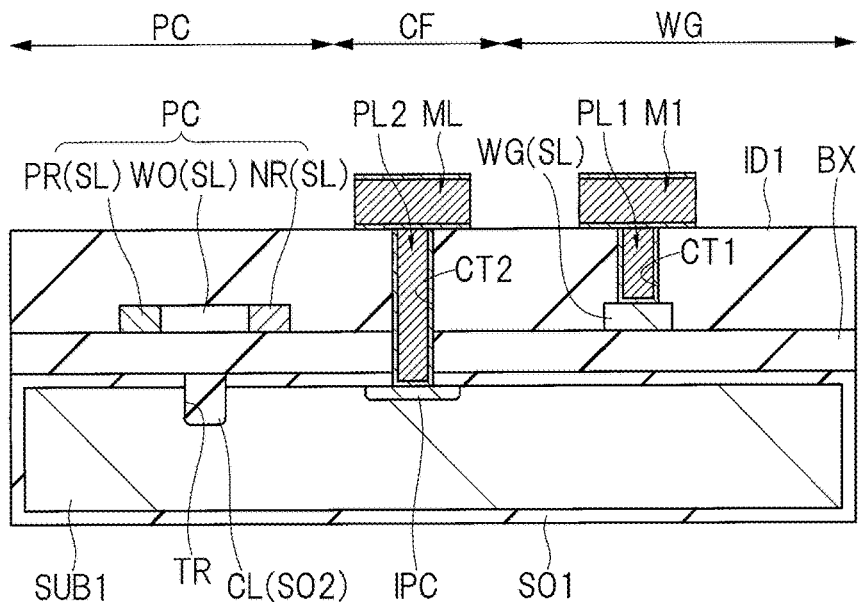
FIG. 18 is a cross-sectional view showing a principal part in the manufacturing process of the semiconductor device continued from FIG. 17.
Figure 19:
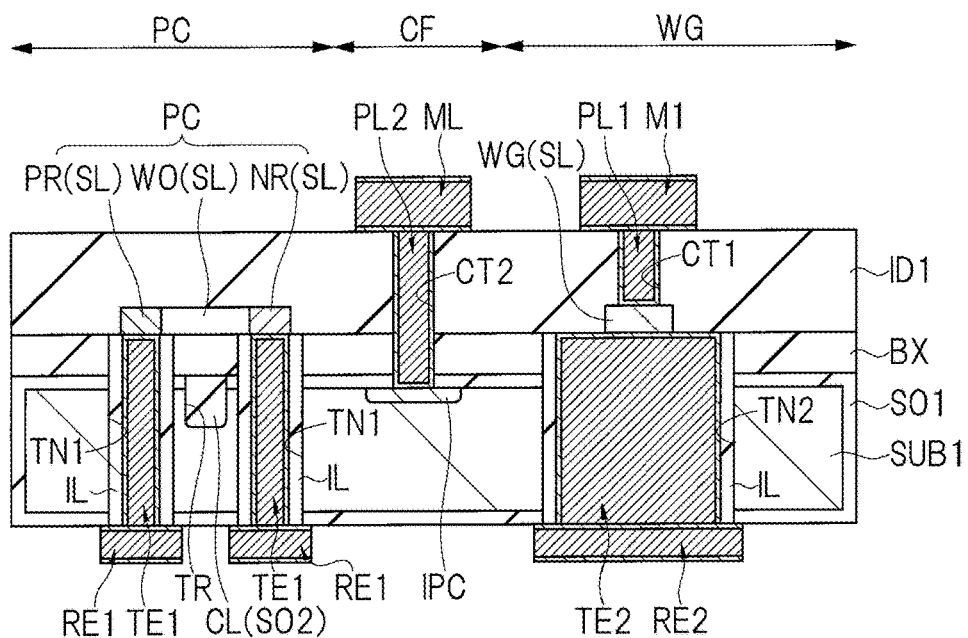
FIG. 19 is a cross-sectional view showing a principal part in the manufacturing process of the semiconductor device continued from FIG. 18.

A manufacturing method of the semiconductor device (optical modulator and accumulated charge extraction and heat dissipation electrode) according to the third embodiment will be described in the order of process with reference to FIGS. 17 to 19. FIGS. 17 to 19 are cross-sectional views each showing a principal part in a manufacturing process of the semiconductor device (optical modulator and accumulated charge extraction and heat dissipation electrode) according to the third embodiment.

First, the SOI substrate manufactured by the <Manufacturing Method of SOI Substrate> described in the first embodiment above is prepared. Namely, the SOI substrate is constituted of the first substrate SUB1, the cladding layer CL, the surface insulating film SO1, the BOX layer BX, and the SOI layer SL.

Next, as shown in FIG. 17, the SOI layer SL is processed by the dry etching method using a resist mask formed on the SOI layer SL to form the SOI layer SL for the optical waveguide WG and the SOI layer SL for the optical modulator PC.

Next, after the resist mask is removed, predetermined impurities are introduced to the SOI layer SL for the optical waveguide WG. Then, p type impurities are introduced into a part of the SOI layer SL for the optical modulator PC (part at which p type semiconductor PR is to be formed), and n type impurities are introduced into another part thereof (part at which n type semiconductor NR is to be formed). Thus, the optical waveguide WG and the optical modulator PC having a pin structure constituted of the optical waveguide WO, the p type semiconductor PR located on one side of the optical waveguide WO, and the n type semiconductor NR located on the other side thereof are formed.

Next, as shown in FIG. 18, impurities are introduced into a predetermined region of the first substrate SUB1 by the ion implantation method, thereby forming the impurity introduction region IPC for fixing the potential of the first substrate SUB1.

Next, the first interlayer insulating film ID1 is formed over the BOX layer BX so as to cover the optical waveguide WG and the optical modulator PC. The first interlayer insulating film ID1 is made of, for example, a silicon oxide film, and has a thickness of, for example, 1 µm or more, preferably, 2 µm or more. Subsequently, an upper surface of the first interlayer insulating film ID1 is planarized by, for example, the CMP method.

Next, the connection hole CT1 reaching the optical waveguide WG is formed in the first interlayer insulating film ID1. Simultaneously, the connection hole CT2 reaching the impurity introduction region IPC is formed in the first interlayer insulating film ID1, the BOX layer BX, and the surface insulating film SO1. Subsequently, a conductive film is buried in the connection holes CT1 and CT2 via the barrier metal, thereby forming the plugs PL1 and PL2 each using the buried conductive film as a main conductive material.

Next, a barrier metal, a metal film (main conductive material), and a barrier metal are sequentially deposited by, for example, the sputtering method over the first interlayer insulating film ID1, and the stacked film thereof is processed by the dry etching method using a resist mask, thereby forming the first layer wiring M1 electrically connected to the plug PL1 and the electrode wiring ML electrically connected to the plug PL2. The main conductive material constituting the first layer wiring M1 and the electrode wiring ML is made of, for example, aluminum or the like, and the barrier metal is made of, for example, titanium, tantalum, titanium nitride, tantalum nitride or the like.

The first layer wiring M1 is electrically connected to the optical waveguide WG through the plug PL1, and the electrode wiring ML is electrically connected to the impurity introduction region IPC through the plug PL2.

Thereafter, wirings in upper layers, protective films and others are further formed. Subsequently, the surface insulating film SO1 on the lower surface side of the first substrate SUB1 is removed, and the first substrate SUB1 is ground from the lower surface side to reduce the thickness of the first substrate SUB1 to, for example, about 50 µm to 100 µm. Subsequently, the surface insulating film SO1 is formed again on the lower surface of the first substrate SUB1. Through the process described above, the semiconductor device is almost completed.

Next, as shown in FIG. 19, a resist mask is formed on the surface insulating film SO1 formed on the lower surface of the first substrate SUB1, and the surface insulating film SO1, the first substrate SUB1, and the BOX layer BX are processed by the dry etching method using the resist mask. Thus, the first through holes TN1 each reaching the p type semiconductor PR and the n type semiconductor NR of the optical modulator PC and the second through hole TN2 reaching a part of the optical waveguide WG are formed in the surface insulating film SO1, the first substrate SUB1, and the BOX layer BX.

Since the thickness of the BOX layer BX is 1 µm or less, the BOX layer BX can be easily processed, and the manufacturing time can be shortened.

Next, the insulating film IL is formed on the rear surface of the SOI substrate including the bottom surface and the side surface of the first through hole TN1 and the bottom surface and the side surface of the second through hole TN2. The insulating film IL is, for example, a silicon oxide film formed by the plasma CVD method, and has a thickness of, for example, about 0.5 µm.

Next, the insulating film IL on the bottom surfaces of the first through hole TN1 and the second through hole TN2 and the rear surface of the SOI substrate is removed by the anisotropic dry etching method, so that the insulating film IL1 is left only on the side surface of the first through hole TN1 and the side surface of the second through hole TN2.

Next, after a barrier metal is formed over the rear surface of the SOI substrate, a copper seed layer (not shown) is formed over the barrier metal, and a copper plating film is further formed over the seed layer by the electrolytic plating method. The barrier metal is made of, for example, titanium, tantalum, titanium nitride, tantalum nitride or the like. Subsequently, the copper plating film, the seed layer, and the barrier metal other than the inside of the first through hole TN1 and the second through hole TN2 are removed by, for example, the CMP method, thereby forming the through electrode TE1 using the copper plating film as a main conductive material in the first through hole TN1 and the through electrode TE2 using the copper plating film as a main conductive material in the second through hole TN2.

Next, barrier metal is formed over the rear surface of the SOI substrate so as to be electrically connected to the through electrodes TE1 and TE2, and a main conductive material made of, for example, aluminum, copper, or aluminum-copper alloy and a barrier metal are sequentially deposited. The barrier metals formed on the lower surface and the upper surface of the main conductive material are made of, for example, titanium, tantalum, titanium nitride, tantalum nitride or the like.

Thereafter, the stacked film of the barrier metal, the main conductive material, and the barrier metal is processed by the dry etching method using a resist mask, thereby forming the rear surface electrode RE1 and the rear surface electrode RE2 constituted of the stacked film and electrically connected to the through electrode TE1 and the through electrode TE2, respectively. Through the process described above, the semiconductor device is almost completed.

As described above, according to the third embodiment, the through electrode TE2 that functions as an accumulated charge extraction and heat dissipation electrode is formed on the lower surface side of the optical waveguide WG. Accordingly, since the charge accumulated in the SOI substrate and the heat used for modulation can be easily extracted to the electrode by applying a voltage between the first layer wiring M1 and the through electrode TE2, the reliability of the semiconductor device can be improved. In addition, since the thickness of the BOX layer BX is as small as 1 µm or less, processing of the first through hole TN1, the second through hole TN2, and the connection hole CT2 that penetrate through the BOX layer BX is easy, and the manufacturing time of the semiconductor device can be shortened.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:
1. A semiconductor device, comprising:
   a semiconductor substrate;
   a first insulating film and a second insulating film formed over an upper surface and a lower surface of the semiconductor substrate, respectively;

a third insulating film formed over the first insulating film;
an optical waveguide formed on the third insulating film and made of a semiconductor layer;
a trench located below the optical waveguide and formed in the first insulating film and the semiconductor substrate so as to have a first depth from an interface between the third insulating film and the first insulating film; and
a fourth insulating film buried in the trench,
wherein a thickness of the third insulating film is 1 μm or less, and
a distance from an interface between the optical waveguide and the third insulating film to a bottom surface of the trench is 2 μm or more.

2. The semiconductor device according to claim 1, wherein a total thickness of the first insulating film and the third insulating film is 1 μm or more.

3. The semiconductor device according to claim 1, wherein a thickness of the first insulating film and a thickness of the second insulating film are 0.4 μm or more and 1 μm or less.

4. The semiconductor device according to claim 1, further comprising:
a first impurity region having a trap level formed in a region where the optical waveguide is not formed, so as to have a second depth from the upper surface of the semiconductor substrate.

5. The semiconductor device according to claim 1, further comprising:
a through hole penetrating through the third insulating film, the first insulating film, the semiconductor substrate, and the second insulating film and reaching a lower surface of the optical waveguide;
a fifth insulating film formed on a side surface of the through hole; and
a through electrode buried in the through hole via the fifth insulating film and electrically connected to the optical waveguide.

6. The semiconductor device according to claim 5, further comprising:
a sixth insulating film formed over the third insulating film so as to cover the optical waveguide;
a first connection hole penetrating through the sixth insulating film and reaching an upper surface of the optical waveguide; and
a first electrode formed on the sixth insulating film and electrically connected to the optical waveguide through the first connection hole.

7. The semiconductor device according to claim 5, further comprising:
a second impurity region formed in a region where the optical waveguide is not formed, so as to have a third depth from the upper surface of the semiconductor substrate;
a seventh insulating film formed over the third insulating film so as to cover the optical waveguide;
a second connection hole penetrating through the first insulating film, the third insulating film, and the seventh insulating film and reaching the second impurity region; and
a second electrode formed on the seventh insulating film and electrically connected to the second impurity region through the second connection hole.

8. A manufacturing method of a semiconductor device, comprising the steps of:
(a) preparing a first semiconductor substrate having a first insulating film formed on an upper surface thereof and a second insulating film formed on a lower surface thereof and a second semiconductor substrate having a third insulating film formed on an upper surface thereof;
(b) forming a trench having a first depth from an upper surface of the first insulating film in the first insulating film and the first semiconductor substrate by sequentially processing the first insulating film and the first semiconductor substrate;
(c) burying a fourth insulating film in the trench to form a cladding layer made of the fourth insulating film;
(d) bonding the first semiconductor substrate and the second semiconductor substrate by bonding the first insulating film and the cladding layer to the third insulating film by heat treatment;
(e) processing the second semiconductor substrate to a predetermined thickness to form a semiconductor layer made of the second semiconductor substrate; and
(f) processing the semiconductor layer to form an optical waveguide made of the semiconductor layer in a region overlapping the cladding layer in a plan view,
wherein a thickness of the third insulating film is 1 μm or less, and
a distance from an interface between the optical waveguide and the third insulating film to a bottom surface of the trench is 2 μm or more.

9. The manufacturing method of a semiconductor device according to claim 8,
wherein a total thickness of the first insulating film and the third insulating film is 1 μm or more.

10. The manufacturing method of a semiconductor device according to claim 8,
wherein a thickness of the first insulating film and a thickness of the second insulating film are 0.4 μm or more and 1 μm or less.

11. The manufacturing method of a semiconductor device according to claim 8, further comprising, between the step (b) and the step (c), the step of:
(g) forming a first impurity region having a second depth from the upper surface of the first semiconductor substrate by ion-implanting impurities into a part of the first semiconductor substrate in a region where the optical waveguide is not formed.

12. The manufacturing method of a semiconductor device according to claim 8, further comprising, after the step (f), the steps of:
(h) forming a through hole reaching a lower surface of the optical waveguide by sequentially processing the second insulating film, the first semiconductor substrate, the second insulating film, and the third insulating film;
(i) forming a fifth insulating film on a side surface of the through hole; and
(j) forming a through electrode electrically connected to the optical waveguide in the through hole.

13. The manufacturing method of a semiconductor device according to claim 12, further comprising, after the step (f) and before the step (h), the steps of:
(k) forming a sixth insulating film over the third insulating film so as to cover the optical waveguide;
(l) forming a first connection hole penetrating through the sixth insulating film and reaching an upper surface of the optical waveguide; and
(m) forming a first electrode electrically connected to the optical waveguide through the first connection hole, on the sixth insulating film.

14. The manufacturing method of a semiconductor device according to claim 12, further comprising, after the step (f) and before the step (h), the steps of:
- (n) forming a second impurity region having a third depth from the upper surface of the first semiconductor substrate by ion-implanting impurities into a part of the first semiconductor substrate in a region where the optical waveguide is not formed;
- (o) forming a seventh insulating film over the third insulating film so as to cover the optical waveguide;
- (p) forming a second connection hole penetrating through the seventh insulating film, the third insulating film, and the first insulating film and reaching the second impurity region; and
- (q) forming a second electrode electrically connected to the second impurity region through the second connection hole, on the seventh insulating film.

15. The manufacturing method of a semiconductor device according to claim 8,
wherein the step (f) includes the steps of:
- (f1) applying a resist film over the semiconductor layer;
- (f2) aligning an exposure mask by pattern recognition of the cladding layer, and exposing the resist film;
- (f3) developing the resist film to form a resist mask made of the resist film;
- (f4) processing the semiconductor layer by etching using the resist mask to form the optical waveguide made of the semiconductor layer; and
- (f5) removing the resist mask.

* * * * *